United States Patent
Ikeda (10) Patent No.: US 6,570,449 B2
(45) Date of Patent: May 27, 2003

(54) OPERATION AMPLIFICATION CIRCUIT, CONSTANT VOLTAGE CIRCUIT AND REFERENCE VOLTAGE CIRCUIT

(75) Inventor: Masuhide Ikeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/970,762

(22) Filed: Oct. 5, 2001

(65) Prior Publication Data

US 2002/0163385 A1 Nov. 7, 2002

(30) Foreign Application Priority Data

Oct. 13, 2000 (JP) ........................................ 2000-314259

(51) Int. Cl.[7] .............................................. H03F 3/45
(52) U.S. Cl. ...................................... 330/261; 330/253
(58) Field of Search ................................. 330/253, 261

(56) References Cited

U.S. PATENT DOCUMENTS 5,065,111 A * 11/1991 Tsukuda et al. ............ 330/253
6,275,109 B1 * 8/2001 Tanj .......................... 330/253

FOREIGN PATENT DOCUMENTS

JP 364108 * 3/1991

OTHER PUBLICATIONS

Boni "Op–Ampsoul Startup Circuits for CMOS Badgap References with Near I–V Supply" IEEE Journal of Solid-State Circuits, vol. 37, No. 10, Oct. 2002.*

* cited by examiner

Primary Examiner—Michael B Shingleton
(74) Attorney, Agent, or Firm—Oliff & Berridge, PLC (57) ABSTRACT

The invention provides an operation amplification circuit and the like that can reduce current consumption, is not dependent on the power supply voltage, and can suppress mass-production variations. The present invention is equipped with a bias circuit, a differential amplification circuit and an output amplification circuit. The bias circuit 11 includes a reference voltage circuit and a current mirror circuit. The reference voltage circuit includes a depletion type PMOS transistor and an enhancement type PMOS transistor serially connected to each other. The MOS transistor has a gate electrode that is formed from polysilicon including a P-type impurity, and the MOS transistor has a gate electrode that is formed from polysilicon including an N-type impurity. Furthermore, a voltage corresponding to a difference between threshold voltages of the MOS transistors is generated at a commonly connected section of the MOS transistors as a reference voltage.

13 Claims, 8 Drawing Sheets

Bias circuit

Differential amplification circuit

Output amplification circuit

Bias circuit | Differential amplification circuit | Output amplification circuit

Fig. 8

Bias circuit | Differential amplification circuit | Output amplification circuit

OPERATION AMPLIFICATION CIRCUIT, CONSTANT VOLTAGE CIRCUIT AND REFERENCE VOLTAGE CIRCUIT

BACKGROUND OF THE INVENTION

1. Field of Invention

The present invention relates to an operation amplification circuit that is capable of low current consumption, is not dependent on the power supply voltage, and can reduce variations in the mass production to the minimum level, and a constant voltage circuit that uses the operation amplification circuit.

2. Description of Related Art

Figure 11:
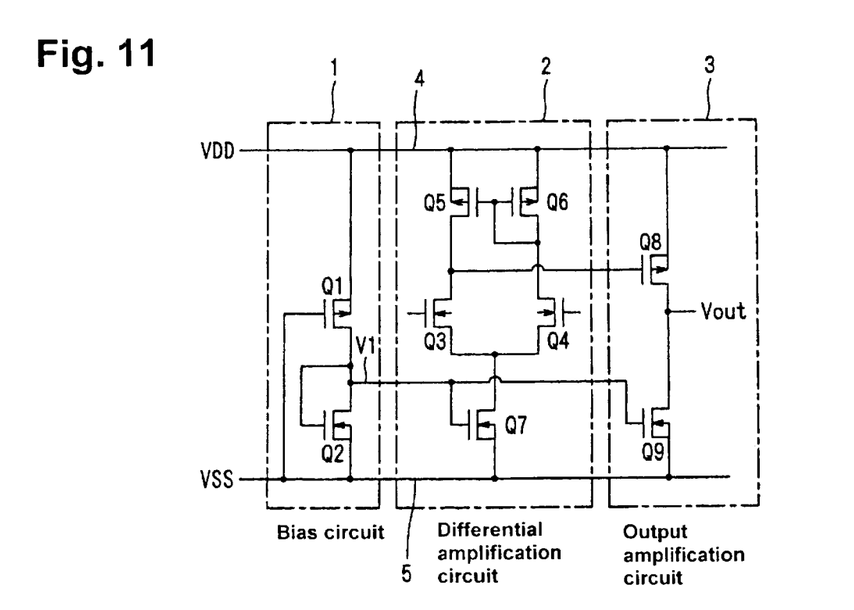
FIG. 11 is a circuit diagram of a structure of a conventional operation amplification circuit.

A conventional operation amplification circuit is shown in FIG. 11. The operation amplification circuit is equipped at least with a bias circuit 1, a differential amplification circuit 2, and an output amplification circuit 3, as shown in FIG. 11.

The bias circuit 1 is a circuit that generates a reference voltage and makes constant a current flowing in a NMOS transistor Q7 of the differential amplification circuit 2 and a current flowing in a NMOS transistor Q9 of the differential amplification circuit 3. For this reason, as shown in FIG. 11, the bias circuit 1 has a PMOS transistor Q1 and an NMOS transistor Q2 serially connected to one another, and the serial circuit is connected between power supply lines 4 and 5.

The differential amplification circuit 2 is a circuit that differentially amplifies a differential signal, and as shown in FIG. 11, is formed from a differential pair of NMOS transistors Q3 and Q4 that is biased by an NMOS transistor Q7 that provides a constant current source. The NMOS transistors Q3 and Q4 are connected to a current mirror circuit that is formed from PMOS transistors Q5 and Q6 as an active load.

The output amplification circuit 3 amplifies and outputs an output signal of the differential amplification circuit 2 by a PMOS transistor Q8 with an NMOS transistor Q9 that is an active load.

In the bias circuit 1 of the conventional operation amplification circuit with the structure described above, the PMOS transistor Q1 can be operated in both of the linear region and the saturation region. Current I that flows in the PMOS transistor Q1 is considered below in both of the cases in which the PMOS transistor Q1 is operated in the linear region and the saturation region.

First, when the PMOS transistor Q1 operates in the linear region, and the power supply voltage VSS is zero (VSS=0), the current I that flows in the PMOS transistor Q1 is provided by Formula (1) as follows:

$$I = \beta_0 \times (W/L)\{(V_{GS} - V_{TP}) \times V_{DS} - 1/2 \times (V_{DS})^2\} \quad (1)$$
$$= \beta_0 \times (W/L)\{(VDD - V_{TP}) \times$$
$$(VDD - V1) - 1/2 \times (VDD - V1)^2\}$$

Also, when the PMOS transistor Q1 operates in the saturation region, the current I that flows in the PMOS transistor Q1 is provided by Formula (1A) as follows:

$$I = 1/2 \times \beta_0 \times (W/L)(V_{GS} - V_{TP})^2 \quad (1A)$$

$$= 1/2 \times \beta_0 \times (W/L)(VDD - V_{TP})^2$$

The determination as to which of the regions that the PMOS transistor Q1 operates is made depending on which of the threshold voltages, the threshold voltage $V_{TP}$ of the PMOS transistor Q1 or the threshold voltage $V_{TN}$ of the NMOS transistor Q2, is larger or smaller than the other. When $V_{TP} > V_{TN}$, the PMOS transistor Q1 operates in the saturation region.

In the above Formulas, $\beta_0$ is a constant determined by the process, W is a channel width of the PMOS transistor Q1, L is a channel length of the same, VDD is a power supply voltage, V1 is a drain voltage of the NMOS transistor Q2, and $V_{TP}$ is a threshold voltage of the PMOS transistor Q1.

Also, the PMOS transistor is an enhancement type transistor when it has a positive threshold voltage, and is a depletion type transistor when it has a negative threshold voltage. The description is made throughout the present specification according to this definition.

As indicated in the above Formula (1) and Formula (1A), the current I that flows in the PMOS transistor Q1 depends on the power supply voltage VDD in either the linear region or the saturation region, and increases generally in proportion to the square of the power supply voltage VDD. Also, the current I determines bias currents that flow in the MOS transistors Q2, Q7 and Q9. Accordingly, since the bias current increases in proportion to the square of the power supply voltage VDD, a problem occurs in that the overall power consumption of the operation amplification circuit increases when the power supply voltage VDD varies (increases).

On the other hand, the threshold voltage $V_{TP}$ of the PMOS transistor Q1 is generally determined by Formula (2) as follows.

$$V_{TP} = -\{2\phi_F + \phi_M - \phi_S - (Q_B/C_0) - (Q_{SS}/C_0)\} \quad (2)$$

In Formula (2), $\phi_F$ is Fermi level of the silicon substrate, $\phi_M$ is a work function of the gate electrode, $\phi_S$ is a work function of the silicon substrate, $Q_B$ is a charge amount in the surface of the silicon, $Q_{SS}$ is an interfacial charge amount between the silicon and the oxide film, and $C_0$ is a capacity per unit area of the gate.

Accordingly, since the threshold voltage $V_{TP}$ of the PMOS transistor Q1 is dependent on six parameters, as indicated in Formula (2), variations in the threshold voltage $V_{TP}$ become large. As a result, a problem occurs in that variations in the manufacturing process also cause variations in the current consumption.

SUMMARY OF THE INVENTION

Accordingly, it is a first object of the present invention to provide an operation amplification circuit that is capable of reducing the current consumption, is not dependent on the power supply voltage, and can reduce variations in the mass production to a minimum.

Also, it is a second object of the present invention to provide a constant voltage circuit that uses the above operation amplification circuit, which is capable of reducing the current consumption, is not dependent on the power supply voltage, and can reduce variations in the mass production to a minimum.

Furthermore, it is a third object of the present invention to provide a reference voltage circuit that can generate a reference voltage that is not dependent on the power supply voltage.

The invention achieves the first object of the invention as discussed below.

Namely, the present invention in accordance with a first aspect includes a differential amplification circuit that receives a differential signal and performs a differential amplification thereof, an output amplification circuit that amplifies an output of the differential amplification circuit, and a bias circuit that determines a bias of the differential amplification circuit and the output amplification circuit. The bias circuit includes a reference voltage circuit that generates a specified reference voltage, and a current mirror circuit based on the reference voltage generated by the reference voltage circuit. The reference voltage circuit includes a first MOS transistor and a second MOS transistor of an identical conduction type that are serially connected to one another. A gate electrode of the first MOS transistor is formed from polysilicon including a P-type impurity and connected to a source electrode thereof, and a gate electrode of the second MOS transistor is formed from polysilicon including an N-type impurity and is connected to a drain electrode thereof. A voltage corresponding to a difference between threshold voltages of the MOS transistors is generated at a common connection section of the MOS transistors as the reference voltage.

In the operation amplification circuit discussed above, the first MOS transistor can be a depletion type transistor and the second MOS transistor can be an enhancement type transistor.

In the operation amplification circuit discussed above, the first MOS transistors can be serially connected in a plurality of stages.

By the inventions set forth above, the reference voltage circuit can generate a reference voltage that is not dependent on the power supply voltage, whereby a bias current (current consumption) of each of the circuits can be reduced.

Furthermore, in accordance with the invention set forth above, the power supply voltage of the operation amplification circuit (operation amplifier) can be increased compared to the one with one transistor.

The present invention in accordance with another aspect includes a differential amplification circuit that receives a differential signal and performs a differential amplification thereof, an output amplification circuit that amplifies an output of the differential amplification circuit, and a bias circuit that determines a bias of the differential amplification circuit and the output amplification circuit. The bias circuit includes a reference voltage circuit that generates a specified reference voltage; the reference voltage circuit includes a first MOS transistor and a second MOS transistor of an identical conduction type that are serially connected to one another. A gate electrode of the first MOS transistor is formed from polysilicon including an N-type impurity and connected to a drain electrode thereof, and a gate electrode of the second MOS transistor is formed from polysilicon including a P-type impurity and is connected to a source electrode thereof. A voltage corresponding to a difference between threshold voltages of the MOS transistors is generated at a common connection section of the MOS transistors as the reference voltage.

In the operation amplification circuit discussed above, the first MOS transistor can be an enhancement type transistor and the second MOS transistor can be a depletion type transistor.

By the inventions set forth above, the reference voltage circuit can generate a reference voltage that is not dependent on the power supply voltage, whereby the bias current (current consumption) of each of the circuits can be reduced.

In the operation amplification circuit discussed above, the first MOS transistor and the second MOS transistor can be provided with gate electrodes with the same thickness in oxide films thereof, the same carrier mobility and the same dielectric constant.

According to the structure described above, the generated reference voltage of the reference voltage circuit is not dependent on the thickness of the oxide film, the carrier mobility and dielectric constant of the gate electrodes.

In the operation amplification circuit discussed above, the first MOS transistor and the second MOS transistor can have the same channel length and channel width.

According to the structure described above, the generated reference voltage of the reference voltage circuit is not dependent on physical variations in the channel length and channel width of the transistors, which may be caused by variations in the process.

In the operation amplification circuit discussed above, the channel length of each of the first MOS transistor and the second MOS transistor can be shortened and the oxide film of the gate electrode thereof can be thickened by an amount of the channel length shortened.

According to the structure described above, the area of the transistor can be reduced in view of its layout.

In the operation amplification circuit discussed above, the first MOS transistor and the second MOS transistor can have a LOCOS offset structure.

According to the structure described above, the drain dielectric strength of the transistor is enhanced, and therefore the operation voltage of the operation amplification circuit can be increased.

In the operation amplification circuit discussed above, the first MOS transistor and the second MOS transistor can be subject to channel doping under the same condition to lower threshold voltages thereof.

Meanwhile, to achieve the second object of the present invention, another aspect of the invention is provided below.

Namely, the invention includes an operation amplification circuit set forth above; and a trimming circuit that is connected as a load of the output amplification circuit of the operation amplification circuit to optionally divide an output voltage of the output amplification circuit. A generated reference voltage generated by the reference voltage circuit of the operation amplification circuit is input in one of input terminals of the differential amplification circuit of the operation amplification circuit, and a divided voltage of the trimming circuit is input in the other of the input terminals of the differential amplification circuit.

According to the structure described above, the reference voltage circuit can generate a reference voltage that is not dependent on the power supply voltage, such that the bias current (current consumption) can be reduced. Also, since variations in the reference voltage that is generated by the reference voltage circuit are reduced, the amount of trimming can be reduced and therefore the size of the trimming circuit.

Furthermore, to achieve the third object of the present invention, other aspects of the invention are provided below.

Namely, the invention includes a depletion type MOS transistor of a first conduction type is serially connected to an enhancement type MOS transistor of the first conduction type; a first power supply line that supplies a first potential is connected to a gate electrode and a source electrode of the depletion type MOS transistor; and a second power supply line that supplies a second potential lower than the first potential is connected to a gate electrode and a drain electrode of the enhancement type MOS transistor. The gate electrode of the depletion type MOS transistor includes an impurity of the first conduction type. The gate electrode of the enhancement type MOS transistor includes an impurity of the second conduction type. An output terminal is provided at a connection point of the drain electrode of the depletion type MOS transistor and the source electrode of the enhancement type MOS transistor.

Also, in the reference voltage circuit discussed above, a voltage corresponding to a difference between a threshold voltage of the depletion type MOS transistor and a threshold voltage of the enhancement type MOS transistor is generated at the output terminal as a reference voltage.

According to the inventions with the structure described above, a reference voltage that is not dependent on the power supply voltage can be generated.

DETAILED DESCRIPTION OF PREFERRED EMBODIMENTS

Embodiments of the present invention are described below with reference to the accompanying drawings.

Figure 1:
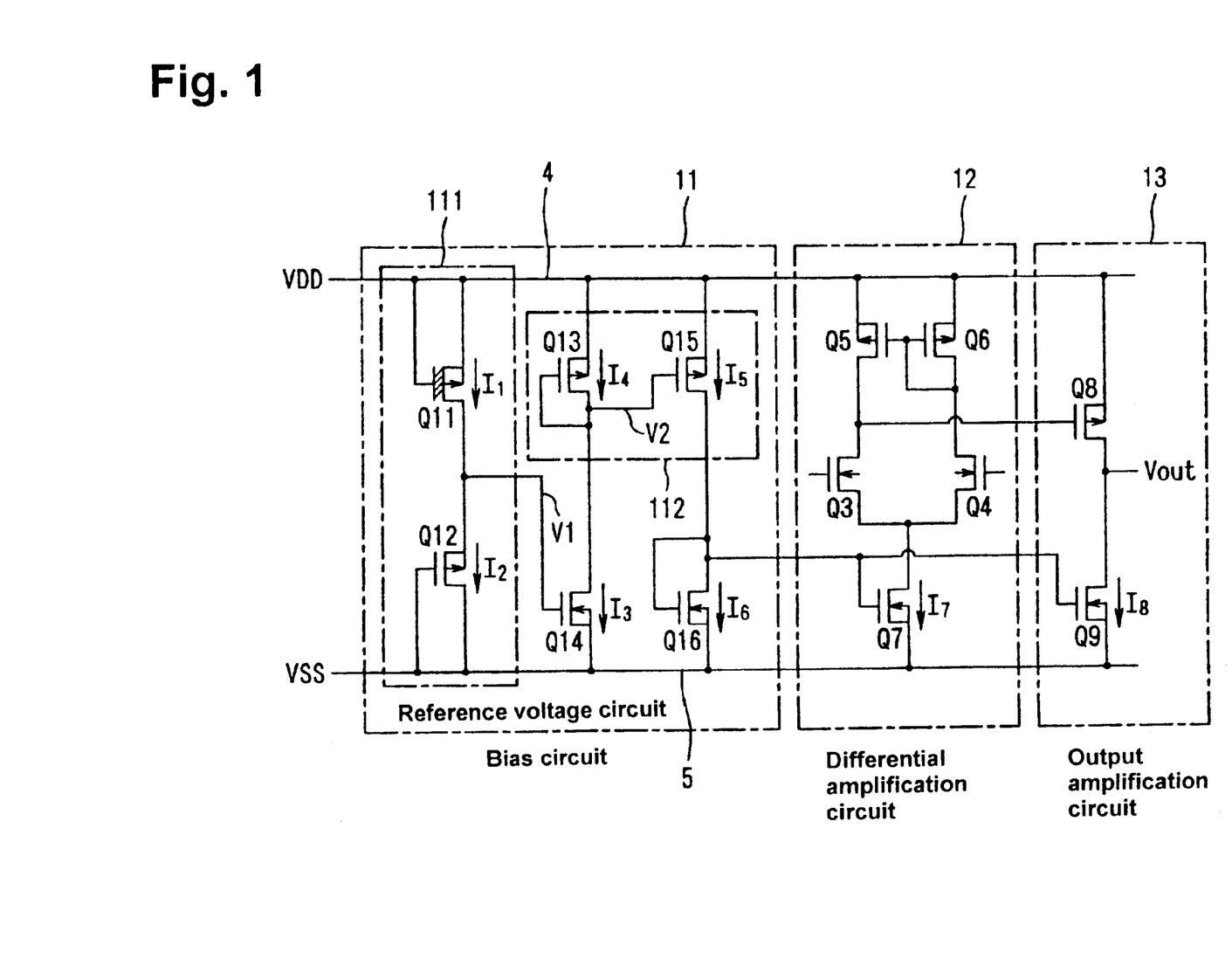
FIG. 1 is a circuit diagram of a structure of an operation amplification circuit in accordance with a first embodiment of the present invention.

FIG. 1 is a circuit diagram of a circuit structure of an operation amplification circuit in accordance with a first embodiment of the present invention.

The operation amplification circuit in accordance with the first embodiment of the present invention is equipped at least with a bias circuit 11, a differential amplification circuit 12, and an output amplification circuit 13, as shown in FIG. 1.

The bias circuit 11 includes a reference voltage circuit 111 that generates a reference voltage, and a current mirror circuit 112 that generates a specified referent current based on the generated reference voltage of the reference voltage circuit 111 and mirrors the generated referent current as an output current. The reference voltage circuit 111 includes a depletion type PMOS transistor Q11 and an enhancement type PMOS transistor Q12 serially connected to one another. The serial circuit is connected between power supply lines 4 and 5. A reference voltage is generated corresponding to a difference between threshold voltages of the MOS transistors Q11 and Q12, and the generated reference voltage is taken out from a commonly connected section of the MOS transistors Q11 and Q12.

Described more specifically, the PMOS transistor Q11 has a gate electrode and a source electrode connected to the power supply line 4, and a drain electrode thereof is connected to a source electrode of the PMOS transistor Q12 and a gate electrode of the NMOS transistor Q14. The PMOS transistor Q12 has a gate electrode and a drain electrode connected to the power supply line 5, and a source electrode thereof is connected to a gate electrode of the NMOS transistor Q14. Also, a first potential (VDD) is supplied to the power supply line 4, and a second potential (VSS) that is lower than the first potential is supplied to the power supply line 5.

The current mirror circuit 112 includes PMOS transistors Q13 and Q15 that form a current mirror. When a reference voltage of the reference voltage circuit 111 is input in the gate of the NMOS transistor Q14, a constant current flows in the PMOS transistor Q13, and the PMOS transistor Q15 mirrors the constant current such that the constant current also flows in the MOS transistor Q16. Also, the MOS transistors Q16, Q7 and Q9 form a current mirror such that the constant current flows in both of the NMOS transistor Q7 of the differential amplification circuit 12 and the NMOS transistor Q9 of the output amplification circuit 13.

A detailed description is provided below. The PMOS transistor Q13 has a source electrode connected to the power supply line 4, and its gate electrode and drain electrode are commonly connected. The commonly connected section thereof is connected to the drain electrode of the NMOS transistor Q14 as well as the gate electrode of the PMOS transistor Q15. The NMOS transistor Q14 has its gate electrode connected to the commonly connected section of the PMOS transistors Q11 and Q12, and its source electrode connected to the power supply line 5.

Also, the PMOS transistor Q15 has its source electrode connected to the power supply line 4, and its drain electrode connected to the drain electrode of the NMOS transistor Q16. Furthermore, the NMOS transistor Q16 has its gate electrode connected to its drain electrode, in which their connection section is connected to the gate of each of the NMOS transistors Q7 and Q9, and its source electrode connected to the power supply line 5.

The differential amplification circuit 12 and the output amplification circuit 13 have the same structures as those of the differential amplification circuit 2 and the output amplification circuit 3 shown in FIG. 11. Accordingly, the same components are referred to with the same reference numbers and their description is omitted.

Next, structures of the PMOS transistors Q11 and Q12 in the reference voltage circuit 111 are described with reference to FIG. 2.

Figure 2:
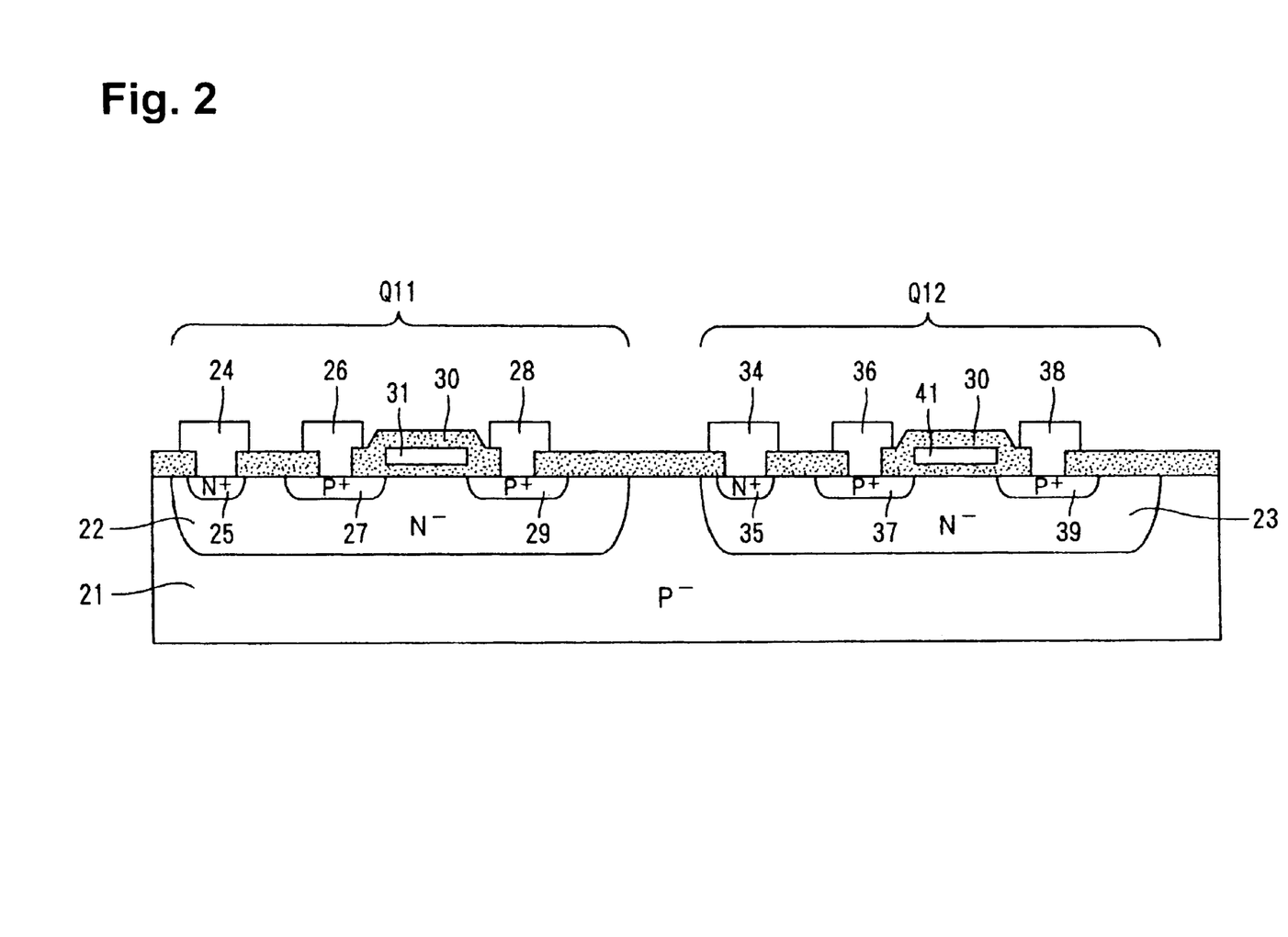
FIG. 2 is a cross-sectional view of a physical structure example of the first embodiment.

The PMOS transistors Q11 and Q12 are formed on a P⁻ substrate 21, respectively, as shown in FIG. 2. More specifically, N⁻ wells 22 and 23 are formed in the P⁻ substrate 21, and they are formed in the N⁻ wells 22 and 23. An N⁺ diffusion layer 25 that is connected to a substrate terminal 24 of the PMOS transistor Q11, a P+ diffusion layer 27 that is connected to a source terminal 26 thereof, and a P+ diffusion layer 29 that is connected to a drain terminal 28 thereof are formed in the N− well 22. A dielectric film 30 formed of silicon oxide is formed at a specified location over the N− well 22, and a gate electrode 31 of the PMOS transistor Q11 is formed in the dielectric film 30. The gate electrode 31 is formed from polysilicon including a P-type impurity, and has a P+ polarity.

An N+ diffusion layer 35 that is connected to a substrate terminal 34 of the PMOS transistor Q12, a P+ diffusion layer 37 that is connected to a source terminal 36 thereof, and a P+ diffusion layer 39 that is connected to a drain terminal 38 thereof are formed in the N− well 23. A dielectric film 30 formed of silicon oxide is formed at a specified location over the N− well 23, and a gate electrode 41 of the PMOS transistor Q12 is formed in the dielectric film 30. The gate electrode 41 is formed from polysilicon including an N-type impurity, and has an N+ polarity.

For the PMOS transistors Q11 and Q12 have the structure described above. The PMOS transistor Q11 is a depletion type transistor, and the PMOS transistor Q12 is an enhance type transistor. The reason why the PMOS transistor Q11 is a depletion type transistor is described below.

As described above, the threshold voltage of a transistor is determined by Formula (2). As indicated in Formula (2), the threshold voltage is dependent on the work function $\phi_M$ of the gate electrode and the work function $\phi_S$ of the silicon substrate.

Therefore, by adjusting the impurity concentration of the gate electrode or the well, the work function $\phi_M$ of the gate electrode and the work function $\phi_S$ of the silicon substrate can be changed, such that the PMOS transistor Q11 can be made into a depletion type transistor. In other words, the PMOS transistor Q11 can be made to have its threshold voltage $V_{TP}$ (P+) being $V_{TP}$ (P+)<0.

Next, an operation of the operation amplification circuit in accordance with the first embodiment of the present invention having the structure described above is described with reference to FIG. 1.

First, an operation of the reference voltage circuit of FIG. 1 is described. The PMOS transistor Q11 is a depletion type transistor as described above, such that a current flows in the PMOS transistor Q11 even when its gate and source have the same potential. It is noted that, when a gate-source voltage is $V_{GS}$, a threshold voltage is $V_{TP}$ and a drain-source voltage is $V_{DS}$, the PMOS transistor Q11 normally operates in a range in which a high power supply voltage VDD is provided such that a relation of $V_{GS}-V_{TP}=0-V_{TP}<V_{DS}$ is established, in other words, a relation of $V_{GS}-V_{TP}<V_{DS}$ is established, and operates in the saturation region in this instance. Therefore, the current I1 that flows in the PMOS transistor Q11 is represented by Formula (3) as follows:

$$I1=\tfrac{1}{2}\times\beta_{0P1}\times(W_{P1}/L_{P1})\times(0-V_{TP1})^2 \quad (3)$$

In Formula (3), $\beta_{0P1}$ is a parameter determined by the process, $W_{P1}$ is a channel width of the PMOS transistor Q11 and $L_{P1}$ is a channel length thereof, and $V_{TP1}$ is a threshold voltage thereof.

Meanwhile, in the PMOS transistor Q12, since its $V_{GS}=V_{DS}$, and a relation of $V_{GS}-V_{TN}<V_{DS}$ is established, it operates in the saturation region. Therefore, the current I2 that flows in the PMOS transistor Q12 is represented by Formula (4) as follows:

$$I2=\tfrac{1}{2}\times\beta_{0P2}\times(W_{P2}/L_{P2})\times(V1-0-V_{TP2})^2 \quad (4)$$

In Formula (4), $\beta_{0P2}$ is a parameter determined by the process, $W_{P2}$ is a channel width of the PMOS transistor Q12, $L_{P2}$ is a channel length thereof, and $V_{TP2}$ is a threshold voltage thereof, and V1 is a voltage (reference voltage) at a commonly connected point between the PMOS transistors Q11 and Q12.

Since the current I1 that flows in the PMOS transistor Q11 entirely flows in the PMOS transistor Q12, I1=I2. Therefore, the reference voltage V1 is provided by Formula (5) as follows:

$$V1=V_{TP2}-\sqrt{\{(W_{P1}\div L_{P1})/(W_{P2}\div L_{P2})\times(\beta_{0P1}/\beta_{0P2})\}}\times V_{TP1} \quad (5)$$

In Formula (5), $\sqrt{\{\ \}}$ is a square root of the portion of { }, and the same applies in the cases described below.

According to Formula (5), it is understood that the reference voltage V1 generated by the reference voltage circuit 11 is not dependent on the power supply voltage VDD.

Next, operations of the bias circuit 11 shown in FIG. 1 other than the portion of the reference voltage generation circuit 111 is described below. In other words, an operation to determine the bias current by the NMOS transistor Q14, and a current mirror operation by the PMOS transistors Q13 and Q15 are described.

In the following description, the power supply voltage VDD is provided such that the NMOS transistor Q14 operates in the saturation region. In other words, the power supply voltage VDD is provided to satisfy the relation of $V_{GS}-V_{TN}<V_{DS}$, in other words to establish the relation of $V1-V_{TN}<V2$ ($\cong$VDD-$V_{TP}$).

First, the bias current I3 that flows in the NMOS transistor Q14 is provided by Formula (6) as follows:

$$I3=\tfrac{1}{2}\times\beta_{0N}\times(W_{N3}/L_{N3})\times(V1-V_{TN})^2 \quad (6)$$

In Formula (6), $\beta_{0N}$ is a parameter determined by the process, $W_{N3}$ is a channel width of the NMOS transistor Q14 and $L_{N3}$ is a channel length thereof, and $V_{TN}$ is a threshold voltage thereof.

As understood from Formula (6), the bias current I3 stably flows without depending on the power supply voltage VDD. Also, by changing the channel width $W_{N3}$ and channel length $L_{N3}$ of the NMOS transistor Q14, the bias current I3 can be set at an optional value. Therefore, the bias current I3 is determined by the size of the NMOS transistor Q14 and the reference voltage V1 applied to its gate by the reference voltage circuit 111.

Also, the current I4 that flows in the PMOS transistor Q13 is the above-described bias current I3 itself, and therefore the current I4 is provided by Formula (7) as follows:

$$I4=I3=\tfrac{1}{2}\times\beta_{0P}\times(W_{P4}/L_{P4})\times(VDD-V2-V_{TP})^2 \quad (7)$$

It is noted that, in Formula (7), $\beta_{0P}$ is a parameter determined by the process, $W_{P4}$ is a channel width of the NMOS transistor Q13 and $L_{P4}$ is a channel length thereof, $V_{TP}$ is a threshold voltage thereof, and V2 is a drain voltage thereof.

The drain voltage V2 of the PMOS transistor Q13 is determined in a manner that the bias current I3 determined in the NMOS transistor Q14 flows.

Furthermore, the current I5 that flows in the PMOS transistor Q15 is provided by Formula (8) as follows:

$$I5=\tfrac{1}{2}\times\beta_{0P}\times(W_{P5}/L_{P5})\times(VDD-V2-V_{TP})^2 \quad (8)$$

In Formula (8), $\beta_{0P}$ is a parameter determined by the process, $W_{P5}$ is a channel width of the NMOS transistor Q15 and $L_{P5}$ is a channel length thereof, and $V_{TP}$ is a threshold voltage thereof.

When the PMOS transistor Q13 and the PMOS transistor Q15 have the same transistor size, I4=I5, and the same current flows in both of the MOS transistors Q13 and Q15. Therefore, the PMOS transistors Q13 and Q15 operate as a current mirror circuit.

Next, operations of the constant current supply of the differential amplification circuit 12 and the output amplification circuit 13 is described.

The current I5 that flows in the PMOS transistor Q15 is a current I6 that flows in the NMOS transistor Q16, and therefore I5=I6. Also, the NMOS transistor Q16 is in a current mirror relation with the NMOS transistors Q7 and Q9. Accordingly, for example, when the NMOS transistors Q16, Q7 and Q9 have the same transistor size, the same current flows in the NMOS transistors Q16, Q7 and Q9.

Next, the reason why the threshold voltage $V_{TP}$ (P+) of the PMOS transistor Q11 becomes lower than the threshold voltage $V_{TP}$ (N+) of the PMOS transistor Q12 is described below.

The threshold voltage of a PMOS transistor is generally represented by Formula (2) as described above.

In Formula (2), the work function $\phi_M$ of the gate electrode is singly determined by the material of the gate electrode. Also, the work function $\phi_S$ of the silicon substrate may be singly determined if the impurity distribution is uniform.

Therefore, when the gate electrode is formed from polysilicon, the work function $\phi_M$ of the gate electrode changes as the concentration of the impurity to the gate electrode is changed. In comparing the work function $\phi_{MP}$ of a polysilicon gate electrode having a P+ gate electrode polarity with the work function $\phi_{MN}$ of a polysilicon gate electrode having an N+ gate electrode polarity, it is noted that the work function is larger when the gate electrode polarity is P+.

In other words, the work function $\phi_{MP}$ and the work function $\phi_{MN}$ have a relation defined by Formula (9) as follows:

$$\phi_{MP} - \phi_{MN} > 0 \qquad (9)$$

As a result, the threshold voltage $V_{TP}$ (P+) of the PMOS transistor Q11 and the threshold voltage $V_{TP}$ (N+) of the PMOS transistor Q12 are represented by Formula (10) and Formula (11), respectively, as follows:

$$v_{TP}(P^+) = -\{2\phi_F + \phi_{MP} - \phi_S - (Q_B/C_0) - (Q_{SS}/C_0)\} \qquad (10)$$

$$V_{TP}(N^+) = -\{2\phi_F + \phi_{MN} - \phi_S - (Q_B/C_0) - (Q_{SS}/C_0)\} \qquad (11)$$

Furthermore, the following Formula (12) is established according to Formulas (9) through (11).

$$V_{TP}(N^+) - V_{TP}(P^+) = \phi_{MP} - \phi_{MN} > 0 \qquad (12)$$

It is understood from Formula (12) that the threshold voltage $V_{TP}$ (P+) of the PMOS transistor Q11 is lower than the threshold voltage $V_{TP}$ (N+) of the PMOS transistor Q12.

Next, first through third modified examples of the operation amplification circuit in accordance with the first embodiment of the present invention are described with reference to FIGS. 3 through 5.

Figure 3:
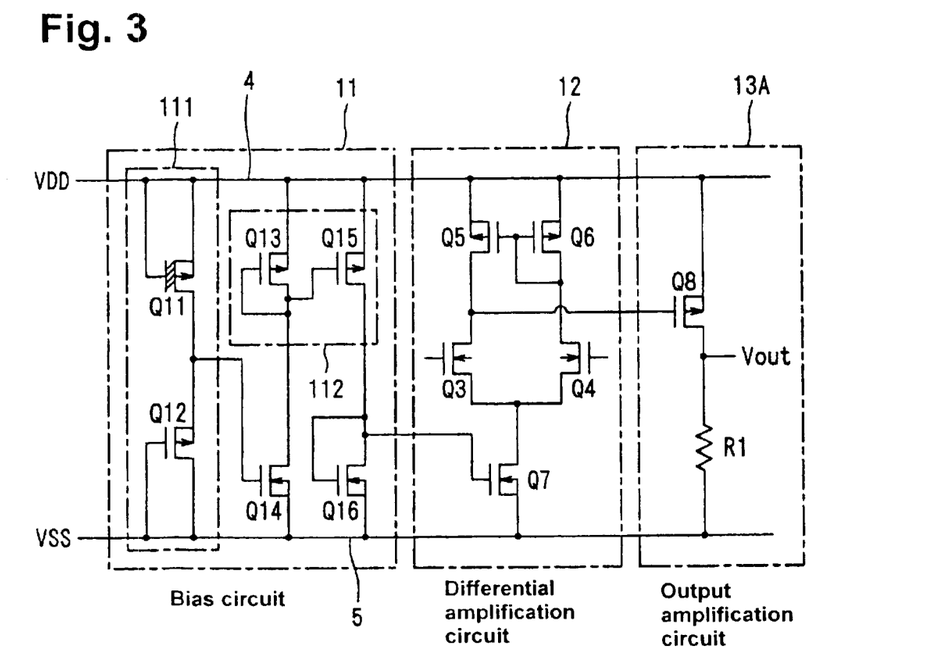
FIG. 3 is a circuit diagram of a structure of a first modified example of the first embodiment of the present invention.

In accordance with the first modified example, the output amplification circuit 13 of FIG. 1 is replaced with an output amplification circuit 13A as shown in FIG. 3. In other words, the NMOS transistor Q9 of the output amplification circuit 13 of FIG. 1 is replaced with a resistor R1 as shown in FIG. 3. Other components of the first modified example are the same as those of the operation amplification circuit shown in FIG. 1, and therefore the same components are referred to by the same reference numbers and their description is omitted.

Figure 4:
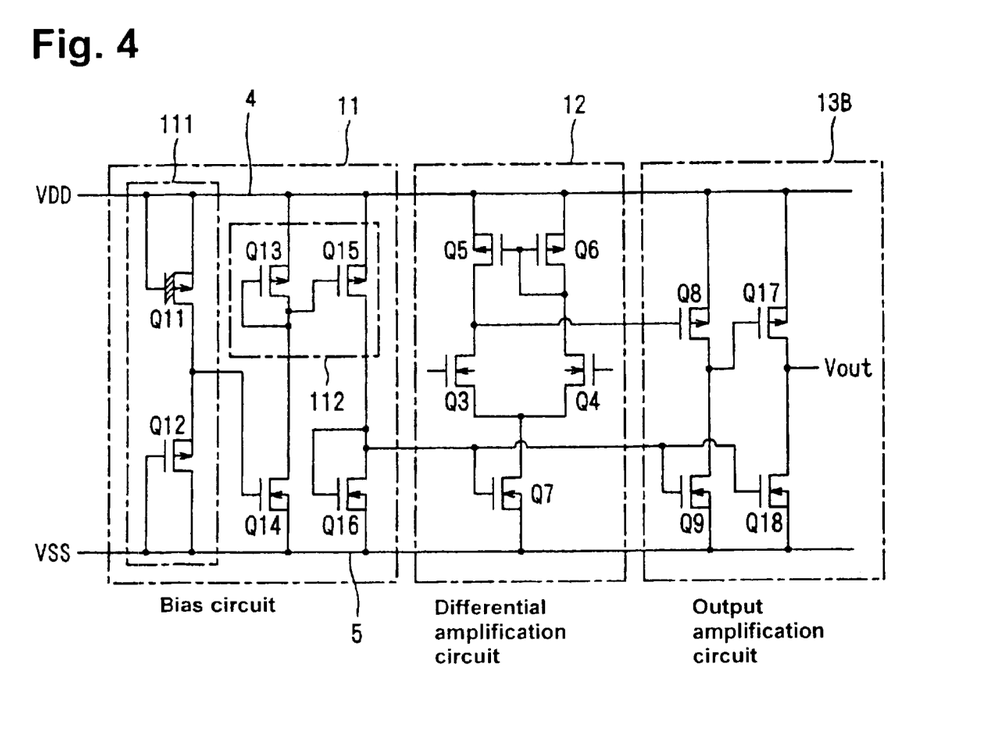
FIG. 4 is a circuit diagram of a structure of a second modified example of the first embodiment of the present invention.

In accordance with the second modified example, the output amplification circuit 13 of FIG. 1 is replaced with a two-stage output amplification circuit 13B as shown in FIG. 4 to increase the gain. In other words, in addition to the MOS transistors Q8 and Q9 of the output amplification circuit 13 shown in FIG. 1, MOS transistors Q17 and Q18 are added. Other components of the second modified example are the same as those of the operation amplification circuit shown in FIG. 1, and therefore the same components are referred to by the same reference numbers and their description is omitted.

Figure 5:
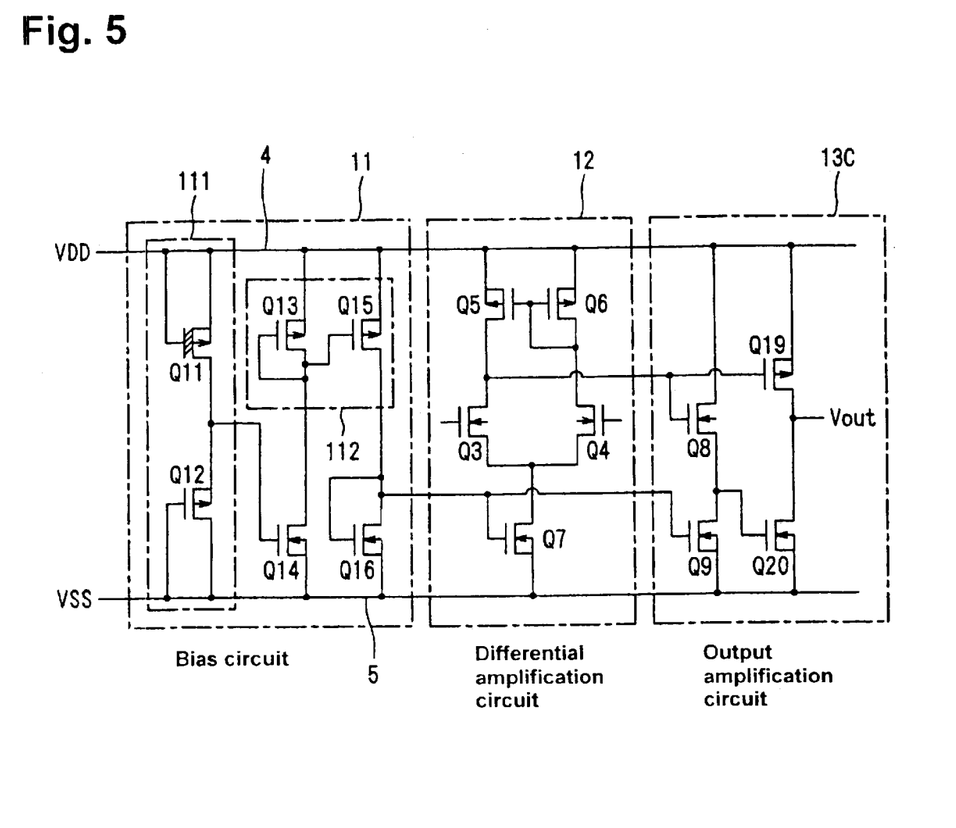
FIG. 5 is a circuit diagram of a structure of a third modified example of the first embodiment of the present invention.

In accordance with the third modified example, the output amplification circuit 13 of FIG. 1 is replaced with an output amplification circuit 13C as shown in FIG. 5 to realize a push-pull circuit.

In other words, in addition to the MOS transistors Q8 and Q9 of the output amplification circuit 13 shown in FIG. 1, MOS transistors Q19 and Q20 are added to perform a push-pull operation. Other components of the third modified example are the same as those of the operation amplification circuit shown in FIG. 1, and therefore the same components are referred to by the same reference numbers and their description is omitted.

Next, a description is provided with respect to conditions in which, in the operation amplification circuit in accordance with the first embodiment of the present invention (including the first through third modified examples), the reference voltage V1 of the reference voltage circuit 111 does not depend on variations in the process parameter $\beta_0$ of the PMOS transistors Q11 and Q12.

The reference voltage V1 of the reference voltage circuit 111 shown in FIG. 1 is defined by Formula (5) as described above.

The process parameter $\beta_0$ in Formula (5) is generally defined by Formula (16) as follows:

$$\beta_0 = (u \times \in)/t_{OX} \qquad (16)$$

In Formula (16), u is a carrier mobility, $\in$ is a dielectric function and $t_{OX}$ is the thickness of an oxide film of the gate electrode.

Therefore, when the PMOS transistors Q11 and Q12 are provided with the same carrier mobility u, dielectric function $\in$ and thickness of the oxide film of the gate electrode $t_{OX}$, Formula (5) can be defined by Formula (17) as follows:

$$V1 = V_{TP2} - \sqrt{\{(W_{P1} \div L_{P1})/(W_{P2} \div L_{P2})\}} \times V_{TP1} \qquad (17)$$

Therefore, the reference voltage V1 of the reference voltage circuit 111 is not dependent on the process parameter $\beta_0$. In other words, the reference voltage V1 is not dependent on the carrier mobility u, the dielectric function $\in$ or the thickness of the oxide film of the gate electrode $t_{OX}$.

Next, a description is provided with respect to conditions in which, in the operation amplification circuit in accordance with the first embodiment of the present invention, the reference voltage V1 of the reference voltage circuit 111 does not depend on physical process variations in the channel length and the channel width of the PMOS transistors Q11 and Q12.

When the channel length $L_{P1}$ and the channel width $W_{P1}$ of the PMOS transistor Q11 are made to be the same as the channel length $L_{P2}$ and the channel width $W_{P2}$ of the PMOS transistor Q12, Formula (5) is defined by Formula (18) as follows:

$$V1 = V_{TP2} - \sqrt{\{(\beta_{0P1}/\beta_{0P2})\}} \times V_{TP1} \qquad (18)$$

Therefore, the reference voltage V1 of the reference voltage circuit 111 does not depend on physical process variations in the channel length and channel width, when the PMOS transistors Q11 and Q12 are provided with the same channel length and channel width.

In this instance, the process parameters $\beta_{OP1}$ and $\beta_{OP2}$ of the PMOS transistors Q11 and Q12 may be further made to be the same, and Formula (18) may be defined by Formula (19) as follows:

$$V1 = V_{TP2} - V_{TP1} \quad (19)$$

Therefore, in this case, the reference voltage V1 of the reference voltage circuit 111 is neither dependent on the process parameters $\beta_0$. In other words, the reference voltage V1 is not dependent on the carrier mobility u, the dielectric function $\in$ or the thickness of the oxide film of the gate electrode $t_{OX}$.

The reference voltage V1 of the reference voltage circuit 111 may be defined according to Formula (19) and Formula (12) by Formula (20) as follows:

$$V1 = V_{TP2} - V_{TP1} = V_{TP}(N^+) - V_{TP}(P^+) = \phi_{MP} - \phi_{MN} > 0 \quad (20)$$

In other words, when the PMOS transistors Q11 and Q12 are manufactured, (A) a step of forming the N⁻ wells 22 and 23, (B) a step of forming the P⁺ diffusion layers 27, 29, 37 and 39, (C) a step of channel doping of the PMOS transistor Q11 and the PMOS transistor Q12, and (D) a step of forming gate oxide films of the PMOS transistor Q11 and the PMOS transistor Q12 may be performed under the same conditions with the same steps. As a result, the reference voltage V1 is provided by Formula (20) shown above. In other words, even when process variations occur in the manufacturing steps, causes of the process variations are mutually countervailed. Accordingly, when the PMOS transistors Q11 and Q12 are provided with the same channel length and channel width, the reference voltage V1 does not depend on process variations.

Next, methods for suppressing the current to be consumed by the PMOS transistors Q11 and Q12 in the reference voltage circuit 111 in the operation amplification circuit in accordance with the first embodiment of the present invention are described.

The current I1 that flows in the PMOS transistor Q1 is defined by Formula (3), and the current I1 is the consumed current. When Formula (16) is substituted for Formula (3), the consumed current I1 is defined by Formula (21) as follows:

$$I1 = (\tfrac{1}{2}) \times (u \times \in)/t_{OX} \times (W_{P1}/L_{P1}) \times (0 - V_{TP1})^2 \quad (21)$$

Also, the current I2 that flows in the PMOS transistor Q12 is defined by a formula similar to Formula (21).

Accordingly, the current consumption of the reference voltage circuit can be suppressed by making the channel length of the PMOS transistors Q11 and Q12 longer. Also, the current consumption can be suppressed by making the thickness $t_{OX}$ of the oxide film of the gate electrode greater. Therefore, in this case, the channel length may be made shorter to the extent that the thickness is made thicker, such that the transistor area can be reduced in terms of its layout.

Figure 6:
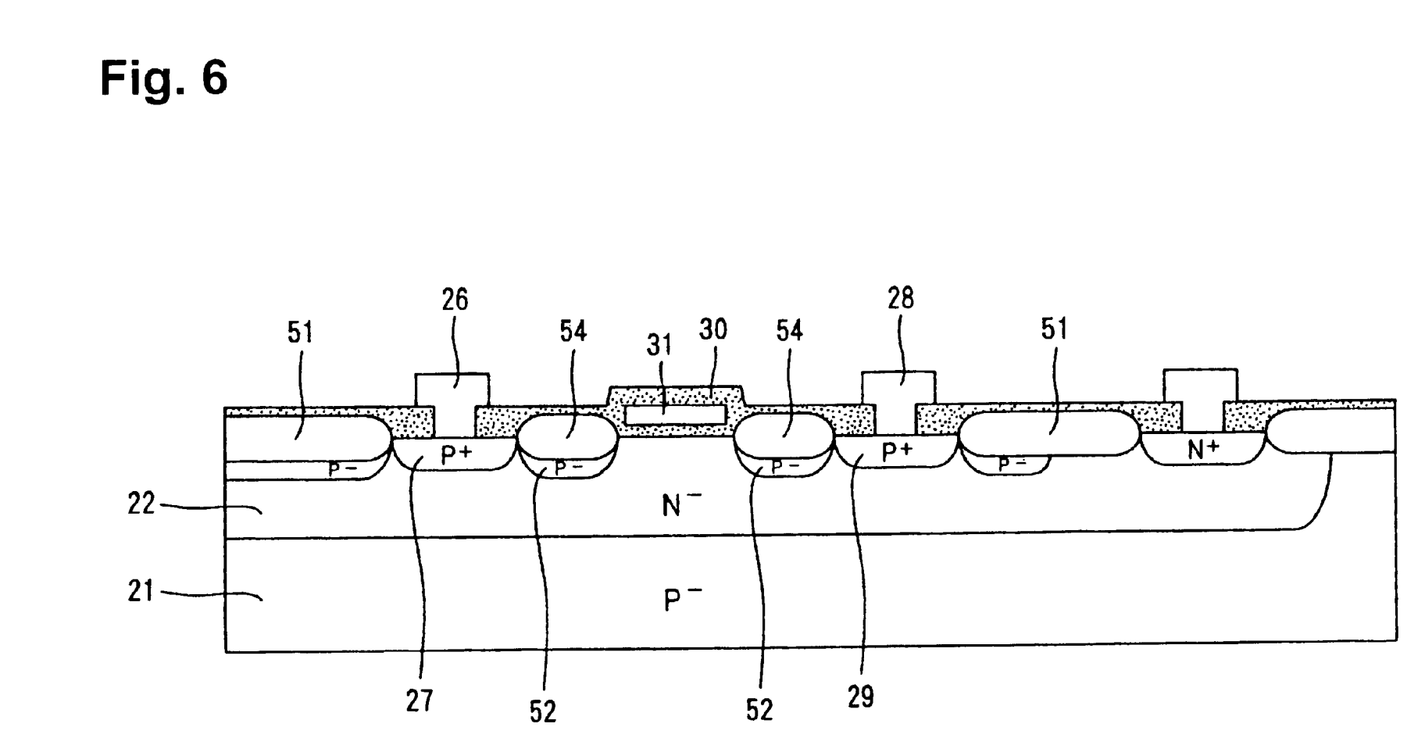
FIG. 6 is a cross-sectional view of another physical structure example of the first embodiment.

Next, the structure of the PMOS transistors Q11 and Q12 of the reference voltage circuit 111 of the operation amplification circuit in accordance with the first embodiment of the present invention shown in FIG. 2 may be replaced with a LOCOS offset structure shown in FIG. 6.

In this case, for example, an N⁻ well 22 is formed in a P⁻ substrate 21, a field oxide film 51 is formed over the N⁻ well 22, and the PMOS transistor Q11 is formed in an area that is surrounded by the field oxide film 51. Also, P⁻ diffusion layers 52 are formed between a gate electrode 31 and a drain electrode 26 and between the gate electrode 31 and a source electrode 28. Further, an oxide film 54 is formed over the P⁻ diffusion layers 52.

With the LOCOS offset structure described above, the dielectric strength of the drains of PMOS transistors Q11 and Q12 is enhanced and therefore the operation voltage of the operation amplification circuit can be raised.

Next, an operation amplification circuit in accordance with a second embodiment of the present invention is described with reference to FIG. 7.

Figure 7:
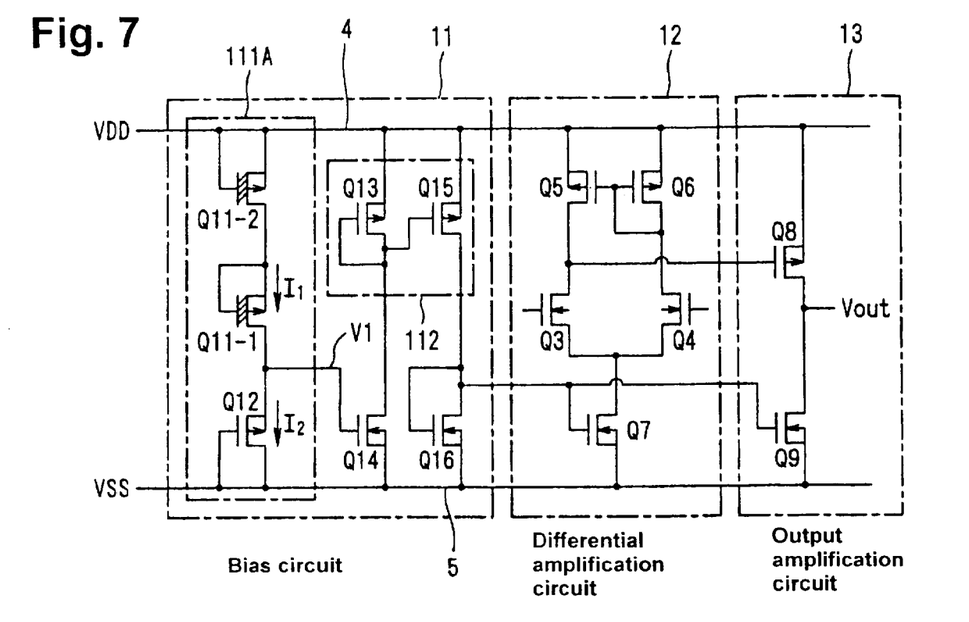
FIG. 7 is a circuit diagram of a structure of an operation amplification circuit in accordance with a second embodiment of the present invention.

In the operation amplification circuit of the second embodiment, the reference voltage circuit 111 shown in FIG. 1 is replaced with a reference voltage circuit 111A shown in FIG. 7. More specifically, the PMOS transistor Q11 of the reference voltage circuit 111 shown in FIG. 1 is replaced with depletion type PMOS transistors Q11-1 and Q11-2 with their gate polarities being P⁺, and they are serially connected to each other. The PMOS transistors Q11-1 and Q11-2 are formed in a two-stage structure, but may be formed in a three-stage structure or more.

Other components are the same as those of the operation amplification circuit shown in FIG. 1, and therefore the same components are referred to by the same reference numbers and their description is omitted.

With the structure described above, the voltage between source and drain of each of the PMOS transistor Q11-1 and the PMOS transistor Q11-2 can be reduced, such that the power supply voltage of the operation amplification circuit can be made to be higher.

Also, with the structure described above, the current I1 that flows in the PMOS transistor Q11-1 is defined by Formula (22) as follows:

$$I1 = \tfrac{1}{2} \times \beta_{OP1} \times (W_{P1}/L_{P1}) \times (0 - V_{TP1})^2 \quad (22)$$

It is noted that, in Formula (22), $\beta_{OP1}$ is a parameter determined by the process, $W_{P1}$ is a channel width of the PMOS transistor Q11-1 and $L_{P1}$ is a channel length thereof, and $V_{TP1}$ is a threshold voltage thereof.

Meanwhile, the current I2 that flows in the PMOS transistor Q12 is represented by Formula (23) as follows:

$$I2 = \tfrac{1}{2} \times \beta_{OP2} \times (W_{P2}/L_{P2}) \times (V1 - V_{TP2})^2 \quad (23)$$

In Formula (23), V1 is a voltage (reference voltage) at a commonly connected point between the PMOS transistors Q11-1 and Q12.

Since the current I1 that flows in the PMOS transistor Q11-1 entirely flows in the PMOS transistor Q12, I1=I2. Therefore, the reference voltage V1 is provided by Formula (24) as follows:

$$V1 = V_{TP2} - \sqrt{\{(W_{P1} \div L_{P1})/(W_{P2} \div L_{P2}) \times (\beta_{OP1}/\beta_{OP2})\}} \times V_{TP1} \quad (24)$$

According to Formula (24), it is understood that the reference voltage V1 of the reference voltage circuit 111A is not dependent on the power supply voltage VDD.

It is noted that, for the reference voltage circuit 111A in accordance with the second embodiment, the contents described with respect to the reference voltage circuit 111 in accordance with the first embodiment are applicable as long as they are consistent with the second embodiment.

Next, an operation amplification circuit in accordance with a third embodiment of the present invention is described with reference to FIG. 8.

Figure 8:
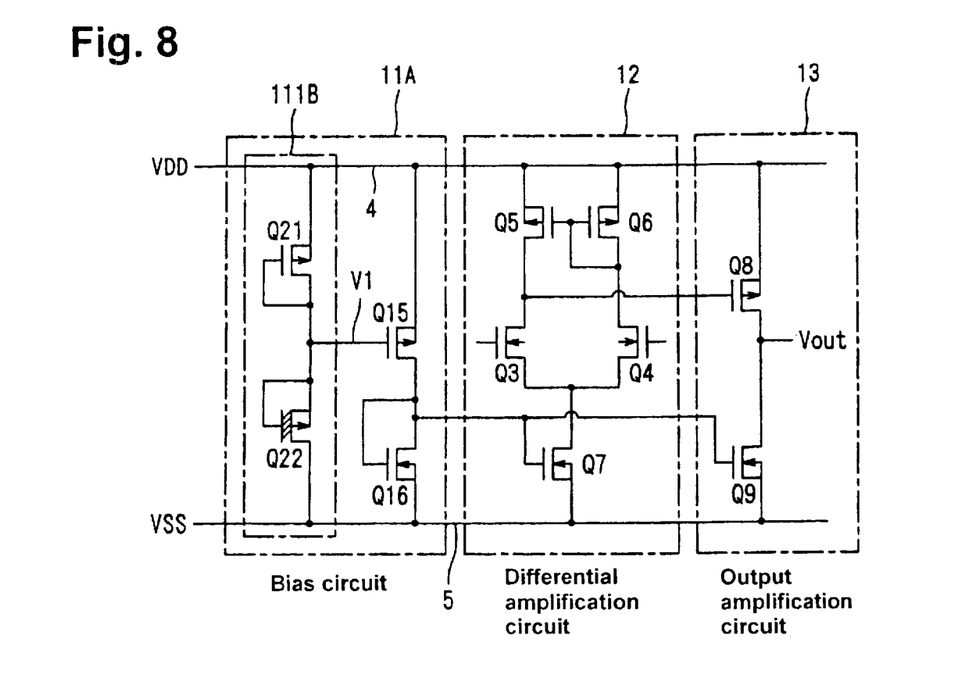
FIG. 8 is a circuit diagram of a structure of an operation amplification circuit in accordance with a third embodiment of the present invention.

In the operation amplification circuit in accordance with the third embodiment, the bias circuit 11 shown in FIG. 1 is replaced with a bias circuit 11A shown in FIG. 8. More specifically, the bias circuit 11A is formed by replacing the reference voltage circuit 111 shown in FIG. 1 with a reference voltage circuit 111B, and omitting the current mirror circuit 112 shown in FIG. 1.

The reference voltage circuit 111B includes, as shown in FIG. 8, an enhancement type PMOS transistor Q21 and a depletion type PMOS transistor Q22 serially connected to one another. The serial circuit is connected between power supply lines 4 and 5. A voltage is generated corresponding to a difference between threshold voltages of the MOS transistors Q21 and Q22 as a reference voltage, and the generated reference voltage is taken out from a commonly connected section between the MOS transistors Q21 and Q22.

The reference voltage circuit 111B corresponds to the one in which the PMOS transistor Q11 and the PMOS transistor Q12 of the reference voltage circuit 111 shown in FIG. 1 are disposed in mutually opposite positions.

Described more specifically, the PMOS transistor Q21 has its source electrode connected to the power supply line 4, and its gate electrode and drain electrode being commonly connected to each other. The commonly connected section is connected to a source electrode of the PMOS transistor Q22 and a gate electrode of the PMOS transistor Q15. Also, the PMOS transistor Q22 has its gate electrode and source electrode commonly connected to each other. The commonly connected section is connected to the drain electrode of the PMOS transistor Q21, and its drain electrode being connected to the power supply line 5.

The PMOS transistor Q21 has a structure similar to that of the PMOS transistor Q12, such that its gate electrode is formed from polysilicon including an N-type impurity. Also, the PMOS transistor Q22 has a structure similar to that of the PMOS transistor Q11, such that its gate electrode is formed from polysilicon including a P-type impurity. It is noted that other components are the same as those of the operation amplification circuit shown in FIG. 1, and therefore the same components are referred to by the same reference numbers and their description is omitted.

Next, an operation of the reference voltage circuit 111B in accordance with the third embodiment having the structure described above is described with reference to FIG. 8.

In the PMOS transistor Q21, since its $V_{GS}=V_{DS}$, a relation of $V_{GS}-V_{TP}<V_{DS}$ is always established, and therefore it operates in the saturation region. Also, in the PMOS transistor Q22, since its $V_{GS}=0$, a relation of $V_{GS}-V_{TP}=-V_{TP}<V_{DS}$ is established, and therefore it operates in the saturation region. Therefore, the drain currents I21 and I22 of the PMOS transistors Q21 and Q22 are provided by Formulas (25) and (26), respectively, as follows:

$$I21=\beta/2\ (VDD-V1-V_{TP21})^2 \quad (25)$$

$$I22=\beta/2\ (0-V_{TP22})^2 \quad (26)$$

It is noted that, in Formula (25), β is a parameter determined by the process, VDD is a power supply voltage, V1 is a reference voltage generated by the reference voltage circuit 111B, and $V_{TP21}$ is a threshold voltage of the PMOS transistor Q21. Also, in Formula (26), $V_{TP22}$ is a threshold voltage of the PMOS transistor Q22.

Since the current I21 that flows in the PMOS transistor Q21 is equal to the current I22 that flows in the PMOS transistor Q22, a relation of I21=I22 is established, and therefore the reference voltage V1 is provided by Formula (27) as follows:

$$V1=VDD-(V_{TP21}-V_{TP22}) \quad (27)$$

In Formula (27), the threshold voltage $V_{TP21}$ and the threshold voltage $V_{TP22}$ are in a relation of $V_{TP21}>V_{TP22}$. Therefore, a constant voltage is obtained as the reference voltage V1 based on the power supply voltage VDD and a difference between the threshold voltage $V_{TP21}$ and the threshold voltage $V_{TP22}$ ($V_{TP21}-V_{TP22}$). Accordingly, the reference voltage V1 that is generated by the reference voltage circuit 111B is constant because it not dependent on variations in the power supply voltage VSS.

Next, a constant voltage circuit in accordance with a first embodiment of the present invention is described with reference to FIG. 9.

Figure 9:
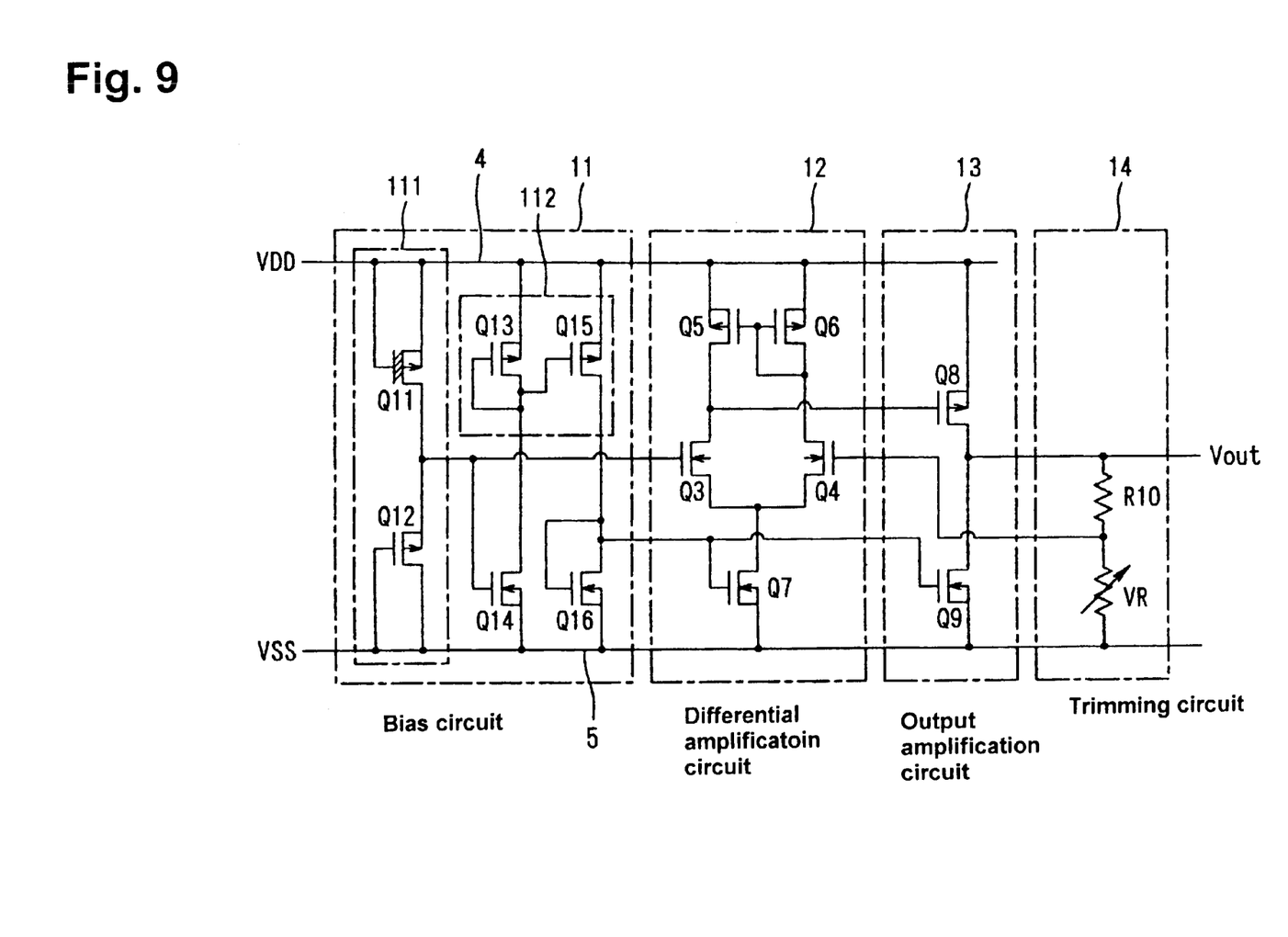
FIG. 9 is a circuit diagram of a structure of a constant voltage circuit in accordance with a first embodiment of the present invention.

The constant voltage circuit of the first embodiment uses the operation amplification circuit shown in FIG. 1 to form a constant voltage circuit shown in FIG. 9.

More specifically, as shown in FIG. 9, the constant voltage circuit of the first embodiment is equipped with an output amplification circuit 13, and a trimming circuit 14 that optionally voltage-divides an output voltage of the output amplification circuit 13. Also, a generated reference voltage generated by a reference voltage circuit 111 is input in one of input terminals (positive input terminal) of a differential amplification circuit 12, and a divided voltage of the trimming circuit 14 is input in the other input terminal (negative input terminal) of the differential amplification circuit 12.

The trimming circuit 14 includes a resistance R10 and a variable resistance device VR that trims that are serially connected to each other. The serial circuit is connected between an output terminal of the output amplification circuit 13 and the power supply voltage VSS. A commonly connected section of the resistance R10 and the variable resistance device VR is connected to a gate electrode of a NMOS transistor Q4 of the differential amplification circuit 12.

Other components are the same as those of the operation amplification circuit shown in FIG. 1, and therefore the same components are referred to by the same reference numbers and their description is omitted.

Since the constant voltage circuit in accordance with the first embodiment with the structure described above is formed by using the operation amplification circuit shown in FIG. 1, a constant voltage circuit can be provided that is capable of reducing current consumption, is not dependent on the power supply voltage, and can suppress mass-production variations.

When a constant voltage circuit corresponding to the one shown in FIG. 9 is formed using the conventional operation amplification circuit shown in FIG. 11, the reference voltage V1 of the bias circuit 1 is about V1=0.70±0.15V. In this case, the variations are ±21%. Therefore, a trimming circuit that corresponds to the trimming circuit 14 is required to perform trimming to reduce the variations to ±2% (to about 1/10), which requires a trimming on the order of 4 bits (16 states).

On the other hand, in the case of the present embodiment, the reference voltage V1 of the reference voltage circuit 111 is about V1=1.05±0.10V. In this case, the variations are reduced to ±9.5%. Although they need to be trimmed to reduce to about ±2% (to about 1/5) by the trimming circuit 14, this only requires a trimming on the order of 3 bits (8 states). Therefore, the size of the trimming circuit 14 can be reduced compared to the conventional one, and therefore the entire area can be reduced.

The constant voltage circuit of the first embodiment shown in FIG. 9 uses the operation amplification circuit shown in FIG. 1 to form a constant voltage circuit. However, in addition to the operation amplification circuit shown in FIG. 1, the operation amplification circuits shown in FIGS. 3 through 5 and FIG. 7 may also be used to form constant voltage circuits.

Next, a constant voltage circuit in accordance with a second embodiment of the present invention is described with reference to FIG. 10.

Figure 10:
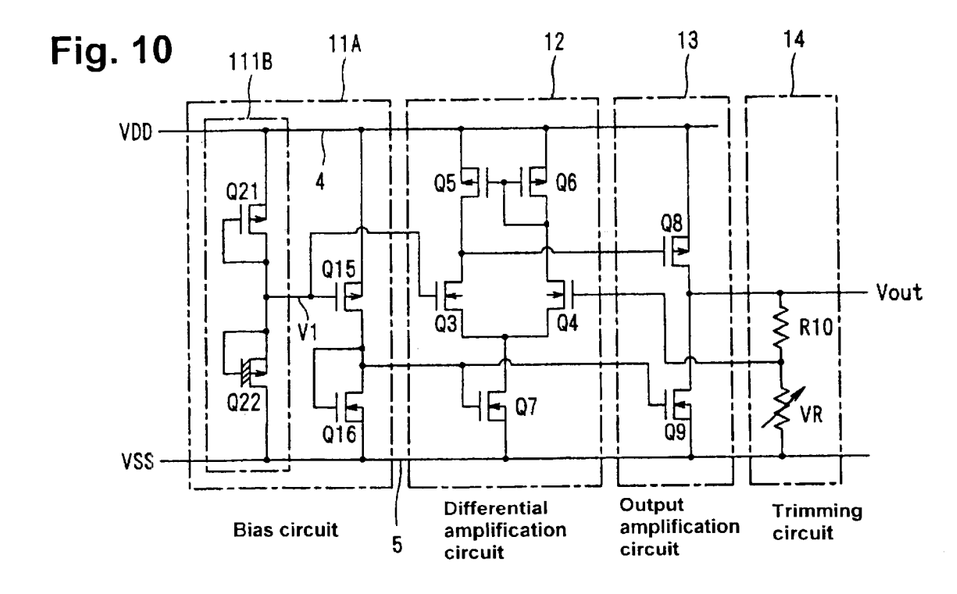
FIG. 10 is a circuit diagram of a structure of a constant voltage circuit in accordance with a second embodiment of the present invention.

The constant voltage circuit of the second embodiment uses the operation amplification circuit shown in FIG. 8 to form a constant voltage circuit shown in FIG. 10.

More specifically, as shown in FIG. 10, the constant voltage circuit of the second embodiment is equipped with an output amplification circuit 13, and a trimming circuit 14 that optionally voltage-divides an output voltage of the output amplification circuit 13. Also, a generated reference voltage generated by a reference voltage circuit 111B is input in one of input terminals (positive input terminal) of a differential amplification circuit 12, and a divided voltage of the trimming circuit 14 is input in the other input terminal (negative input terminal) of the differential amplification circuit 12.

Since the trimming circuit 14 has the same structure as the structure of the trimming circuit 14 shown in FIG. 9, its description is omitted. Also, other components are the same as those of the operation amplification circuit shown in FIG. 8, and therefore the same components are referred to by the same reference numbers and their description is omitted.

Since the constant voltage circuit in accordance with the second embodiment with the structure described above is formed by using the operation amplification circuit shown in FIG. 8, a constant voltage circuit can be provided that is capable of reducing current consumption, is not dependent on the power supply voltage, and can suppress mass-production variations.

As described above, an operation amplification circuit in accordance with the present invention can reduce the current consumption, is not dependent on the power supply voltage, and can suppress mass-production variations.

Also, a constant voltage circuit in accordance with the present invention uses an operation amplification circuit in accordance with the present invention, and therefore can reduce the current consumption, is not dependent on the power supply voltage, and can suppress mass-production variations.

Furthermore, a reference voltage circuit in accordance with the present invention can generate a reference voltage that is not dependent on the power supply voltage.

What is claimed is:

1. An operation amplification circuit, comprising:
a differential amplification circuit that receives a differential signal and performs a differential amplification thereof;
an output amplification circuit that amplifies an output of the differential amplification circuit; and
a bias circuit that determines a bias of the differential amplification circuit and the output amplification circuit, the bias circuit including a reference voltage circuit that generates a specified reference voltage, and a current mirror circuit based on the reference voltage generated by the reference voltage circuit, the reference voltage circuit including a first MOS transistor and a second MOS transistor of an identical conduction type serially connected to one another, the first MOS transistor including a gate electrode that is formed from polysilicon including a P-type impurity and connected to a source electrode thereof, the second MOS transistor including a gate electrode that is formed from polysilicon including an N-type impurity and connected to a drain electrode thereof, a voltage corresponding to a difference between threshold voltages of the first and second MOS transistors being generated at a common connection section of the first and second MOS transistors as the reference voltage.

2. The operation amplification circuit according to claim 1, the first MOS transistor being a depletion type transistor and the second MOS transistor being an enhancement type transistor.

3. The operation amplification circuit according to claim 1, the first MOS transistors being serially connected in a plurality of stages.

4. An operation amplification circuit, comprising:
a differential amplification circuit that receives a differential signal and performs a differential amplification thereof;
an output amplification circuit that amplifies an output of the differential amplification circuit; and
a bias circuit that determines a bias of the differential amplification circuit and the output amplification circuit, the bias circuit including a reference voltage circuit that generates a specified reference voltage, the reference voltage circuit including a first MOS transistor and a second MOS transistor of an identical conduction type serially connected to one another, the first MOS transistor including a gate electrode that is formed from polysilicon including an N-type impurity and connected to a drain electrode thereof, the second MOS transistor including a gate electrode that is formed from polysilicon including a P-type impurity and connected to a source electrode thereof, a voltage corresponding to a difference between threshold voltages of the first and second MOS transistors being generated at a common connection section of the first and second MOS transistors as the reference voltage.

5. The operation amplification circuit according to claim 4, the first MOS transistor being an enhancement type transistor and the second MOS transistor being a depletion type transistor.

6. The operation amplification circuit according to claim 1, the first MOS transistor and the second MOS transistor being provided with gate electrodes having the same thickness in oxide films thereof, the same carrier mobility and the same dielectric constant.

7. The operation amplification circuit according to claim 1, the first MOS transistor and the second MOS transistor having the same channel length and channel width.

8. The operation amplification circuit according to claim 1, the channel length of each of the first MOS transistor and the second MOS transistor being shortened and the oxide film of the gate electrode thereof being thickened by an amount of the channel length shortened.

9. The operation amplification circuit according to claim 1, the first MOS transistor and the second MOS transistor having a LOCOS offset structure.

10. The operation amplification circuit according to claim 1, the first MOS transistor and the second MOS transistor being subject to channel doping under the same condition to lower threshold voltages thereof.

11. A constant voltage circuit, comprising:
an operation amplification circuit according to claim 1; and
a trimming circuit that is connected as a load of the output amplification circuit of the operation amplification circuit to optionally divide an output voltage of the output amplification circuit, a generated reference voltage generated by the reference voltage circuit of the operation amplification circuit being input in one of input terminals of the differential amplification circuit of the operation amplification circuit, and a divided voltage of the trimming circuit is input in another of the input terminals of the differential amplification circuit.

12. A reference voltage circuit comprising:

an enhancement type MOS transistor of a first conduction type, the enhancement type MOS transistor including a gate electrode and a drain electrode, the gate electrode of the enhancement type MOS transistor including an impurity of the second conduction type;

a depletion type MOS transistor of the first conduction type serially connected to the enhancement type MOS transistor of the first conduction type, the depletion type MOS transistor including a gate electrode and a source electrode, the gate electrode of the depletion type MOS transistor including an impurity of the first conduction type;

a first power supply line that supplies a first potential is connected to the gate electrode and the source electrode of the depletion type MOS transistor;

a second power supply line that supplies a second potential lower than the first potential is connected to the gate electrode and the drain electrode of the enhancement type MOS transistor; and an output terminal provided at a connection point of the drain electrode of the depletion type MOS transistor and the source electrode of the enhancement type MOS transistor.

13. The reference voltage circuit according to claim 12, a voltage corresponding to a difference between a threshold voltage of the depletion type MOS transistor and a threshold voltage of the enhancement type MOS transistor being generated at the output terminal as a reference voltage.

* * * * *